United States Patent [19]
Kuehnle

[11] Patent Number: 5,128,111
[45] Date of Patent: Jul. 7, 1992

[54] APPARTUS FOR MAKING INORGANIC WEBS AND STRUCTURES FORMED THEREOF

[75] Inventor: Manfred R. Kuehnle, Rte. 103A, New London, N.H. 03257

[73] Assignee: Manfred R. Kuehnle, Bedford, Mass.

[21] Appl. No.: 386,833

[22] Filed: Jul. 27, 1989

Related U.S. Application Data

[63] Continuation of Ser. No. 172,202, Mar. 23, 1988, abandoned.

[51] Int. Cl.[5] .................. C30B 35/00; C30B 15/06
[52] U.S. Cl. ................................. 422/254; 422/246; 422/248; 118/416; 118/422; 156/DIG. 96
[58] Field of Search .................. 422/254, 248, 246; 118/416, 422; 425/223, 224; 156/DIG. 96

[56] References Cited

U.S. PATENT DOCUMENTS

| | | | |
|---|---|---|---|
| 2,051,201 | 8/1936 | Davidson | 425/224 |
| 2,172,018 | 9/1939 | Spencer | 425/224 |
| 2,912,321 | 11/1959 | Brannan | 156/DIG. 96 |
| 3,441,454 | 4/1969 | Shaikh et al. | 118/718 |
| 4,322,263 | 3/1982 | Kudo et al. | 156/620.1 |
| 4,417,944 | 11/1983 | Jewett | 422/246 |
| 4,468,280 | 8/1984 | Bender et al. | 422/246 |
| 4,468,281 | 8/1984 | Bender et al. | 422/254 |
| 4,551,291 | 11/1985 | Wakefield et al. | 264/213 |

FOREIGN PATENT DOCUMENTS

| | | | |
|---|---|---|---|
| 59-166206 | 9/1984 | Japan | 422/254 |
| 740260 | 6/1980 | U.S.S.R. | 422/254 |
| 762907 | 9/1980 | U.S.S.R. | 422/254 |
| 971396 | 11/1982 | U.S.S.R. | 422/254 |
| 1294363 | 3/1985 | U.S.S.R. | 422/254 |

*Primary Examiner*—Robert Kunemund

[57] ABSTRACT

A large thin web having a coherent crystal morphology throughout its extent is made on a continuous basis by drawing a meniscus of the web material from a hot melt thereof onto a heated support surface which moves relative to the melt so that the liquid is distributed as a thin liquid film over that support surface. The moving support surface advances the film progressively past a chiller which establishes a chill zone at the surface of the film which cools the film material at an isothermal front or boundary therein to a temperature below the melting point of the material so that the material solidifies. Also, a crystal seeding bar is located at the chill zone which is brought into contact with the film just ahead of the front so that when the film solidifies in the chill zone it assumes the crystal morphology of the seeding bar. The solidified film that is peeled from the support surface constitutes the finished web, while new material drawn from the melt is added to the support surface upstream from the chill zone so that the process is continuous. Apparatus for controlling the process are also disclosed, as are various articles and structures made from such webs. Also disclosed are means for depositing additional layers of material on the web while preserving a compatible crystal morphology throughout the entire plural-layer structure.

11 Claims, 3 Drawing Sheets

APPARTUS FOR MAKING INORGANIC WEBS AND STRUCTURES FORMED THEREOF

RELATED APPLICATION

This application is a continuation of Ser. No. 172,202 filed Mar. 23, 1988, now abandoned.

This invention relates to a technique for making uniformly thin inorganic crystalling webs, as well as certain structures which, for the first time, become possible to produce economically as a result of this novel technique.

BACKGROUND OF THE INVENTION

One prior method of producing thin, relatively defect free, monocrystalline structures, the Czochralski method, involves drawing a larger solid single crystal body known as a boule from a melt and then slicing the boule with a diamond saw, grinding and polishing it to produce wafers of thin, single crystal material. This process is slow, wasteful, and expensive and is used principally for the production of substrates in the electronics industry. Another method of growing single crystal structures, known as the EFG method (Edge defined, Filmfed, Growth), has found use in the manufacture of solar cells, EPROM windows, and abrasion-resistant plates. A considerable amount of effort has been expended on these two methods with the objective of finding an improved way to produce monocrystalline structures which need not be ground and polished to become useable as windows or substrates for electronic or optical applications. As yet, no satisfactory solution has been found.

Problems arise with the EFG method because of the inability to control flow dynamics and heat dissipation closely enough to prevent the formation of ripples in the crystal structure when it is being pulled from the melt. More particularly, as the crystal is being formed, the locus of solidification of the viscous melt material shifts slightly when the heat dissipation is even minutely retarded. This causes variations in the solidification of the molten mass which, in turn, produce surface unevenness, variations in thickness, and internal growth defects. These problems become more critical as the mass becomes thinner, reaching a point at which the subsequent grinding and polishing required to finish the crystal would fracture the crystal.

Thus, all present crystal forming techniques produce crystal structures whose attainable thinnesses are limited by the mechanical forces required to create final products with smooth, defect free surfaces. Because of this limit in achievable thinness, the single crystal plates and wafers which can be produced by prior methods are still essentially rigid and incapable of being flexed or wound up like ribbons without causing excessive breakage. Indeed, because of their stiffnesses, these crystals have never been considered for use as flexible, elastic members in the optics and electronics industries.

Other problems with crystal structures made by the above known methods stem from the great number of dislocations and irregularities present in the crystal lattices and from contamination by silicon carbide particles from the die or saw used when the crystal is cut into wafers. These dislocations and defects constitute impurities and irregularities in the crystal structure which contribute to breakage and poor yield when additional material layers or coatings are deposited onto the wafer surfaces; they are particularly important if other crystalline layers such as microcircuits are to be grown on the wafers.

Finally, none of the prior techniques enables the making of a uniformly thin, highly flexible monocrystalline web or film which can, with or without grinding and polishing, form a base or foundation for one or more added-on layers, patterns, or coatings to form a composite structure having a coherent crystal morphology throughout all layers.

SUMMARY OF THE INVENTION

Accordingly, this invention aims to provide an ultrathin, optically smooth, inorganic monocrystalline web material.

A fundamentally important goal of this invention is to produce a strong, thin, flexible web whose surfaces are optically smooth, whose thickness is uniform, and whose crystal structure shows a dramatically lower number of defects than prior synthetic single crystal products.

Another object of the invention is to provide such a material which is highly flexible so that it can be rolled up into a roll having a relatively small diameterl Another object is to provide a material of this type which is transparent to light energy over a wide spectral range.

Still another object is to provide an inorganic monocrystalline material in sheet or tape form which is dimensionally stable.

A further object is to make a web-like material which has great optical clarity and a uniform index of refraction throughout its extent.

A further object is to provide a plural layer inorganic structure which has a coherent crystal morphology throughout its extent.

Yet another object is to provide such a plural layer structure in flexible sheet or tape form.

A further object of the invention is to provide a method of making a material or structure having one or more of the above characteristics or properties.

A further object is to provide a method of making thin, inorganic monocrystalline webs on a production basis.

Still another object is to provide an apparatus for making the material and structure described above and for implementing the above method.

It is also an object of this invention to provide method and means to make precise, thin, flexible, inorganic sheets and films while achieving heretofore unattainable production economics by producing the sheets and films rapidly (i.e., 10 cm per/sec or more), and wide (1-2 meters or more) and on a continuous basis.

Another object of this invention is to grow a web-like crystal whose c-axis is perpendicular to the nominal plane of the web.

Another object is to produce a thin, flexible web which can withstand very high temperatures (i.e., 2000°° C.) without losing its strength or dimensional integrity.

Other objects will, in part, be obvious and will, in part, appear hereinafter. The invention accordingly comprises the sequence of steps, feature of construction, combination of elements and arrangement of parts and the articles which will be exemplified in the following detailed description and the scope of the invention will be indicated in the claims.

In general, in accordance with the present invention, a very uniform inorganic web of substantial width and length and with a precisely controlled uniform thinness is drawn from a hot melt of the web material. The unprecedented properties of the resultant web allow the fabrication of novel ribbons, sheets and structures which have great utility as films, substrates and foundations, optoelectronicc recording media, optical and electronic circuit structures and machine parts.

To make the web, a heated support surface is positioned above a heated crucible containing a melt of the web material. To start the process, the support surface is dipped momentarily in the melt, and moved slowly generally parallel to the melt surface. Liquid from the melt adheres to the support surface due to surface tension so that a meniscus extends from the melt to the surface. As the surface moves relative to the crucible, melt liquid is pulled from the crucible via the meniscus which remains stationary, being maintained by the wettability of the surface, and the liquid reaching the support surface spreads over a large area of that surface. The surface tension of the melt material, aided by the uniformly maintained cross-section of the meniscus, produces a very even deposit or film of melt liquid on the support surface with practically zero thickness variation. The actual thickness of the deposited film or coating may be adjusted or controlled by controlling the support surface speed, the support surface melt spacing and the viscosity of the melt via temperature.

To maintain the film deposited on the support surface in liquid form, that surface is heated to a temperature just above the melting point of the film material. The liquid film, formed as aforesaid, is then solidified progressively by advancing the support surface and film thereon through a chilling station which establishes a chill ozne at the film surface which extends transversely to the motion axis of that surface. In that zone, the film is cooled to a temperature below the melting point of the film material so that it solidifies along a transverse isothermal line. Thus, as the film advances through that zone, the film solidifies progressively with an angled solidification isotherm or front between its liquid and solid phases, the isotherm remaining essentially stationary at the chill zone.

Also located at the chill zone is a seed crystal in the form of a chilled bar which extends transversely along the length of that zone. That bar is brought into contact with the liquid film just ahead of its isothermal front. Resultantly, the film liquid at that front solidifies immediately with the same crystal morphology as the seed bar. The contacting bar is now moved away from the chill zone in the same direction and speed as the film that is now solidified and adhered to it. Its crystal structure, having been established in the leading end segment of the film and now present at the film's solidification front, is propagated along the film as successive film deposits pass through the chill zone.

The solidified film or web downstream from the solidification front in the film is peeled from the support surface by moving the seed bar gradually away from the support surface, after which the bar is separated from the web. Preferably, the peeling operation is carried out while the film underside is still liquid at the point of its departure from the support surface. This assures that the underside of the film will have the same crystal orientation as the film top surface actually in contact with the seed bar.

The ease of removal of the latent heat from the thin web leaving the support surface, combined with maintenance of an accurate temperature throughout the solid mass of that surface even as the film passes through the chill zone, permits the web to be grown at an appreciable rate, while assuring an extraordinarily uniform, defect-free crystal growth in the web.

The difference between the thermal coefficient of expansion of the support surface and that of the film when it solidifies, i.e., the film shrinkage, makes it possible to strip or peel the film from the surface with relative ease. The high cohesive strength and dimensional stability of the resultant web assure that the peeling or stripping operation will be complete and continuous.

By replenishing the melt in the crucible while maintaining a constant spacing between the support surface and the melt, the web-forming process can be maintained in a continuous fashion. To avoid surface ripple and thickness variations, the support surface is moved very uniformly. Also, the temperature of the chill zone and the seed bar are motioned to provide correction signals to a feed-back arrangement which controls the thermal gradients through the film in that zone to maintain the constancy of the solidification process. After the web is peeled from the support surface, it is rolled up or otherwise accumulated by a conventional take-up device that maintains essentially zero tension on the film in the chill zone to avoid variations in the web thickness.

As will be described in detail later, one or more layers or coatings may be added to the inorganic web formed as aforesaid. Furthermore, by proper selection and depositing of these added-on materials, the web and each layer theron may provide nucleation sites for the subsequently applied layer so that the entire structure has a high degree of perfection and has a coherent crystal morphology, making the structure especially useful in certain electrical and optical applications to be described later.

Using the method and apparatus described herein, it is possible to produce economically webs having exceptional mechanical, electrical, optical and chemical properties enabling the manufacture of unusual structures, components and parts that make use of those exceptional properties and that, in and of themselves, have new performance parameters.

BRIEF DESCRIPTION OF THE DRAWINGS

For a fuller understanding of the nature and objects of this invention, reference should be had to the following detailed description taken in connection with the accompanying drawings, in which.

DESCRIPTION OF THE PREFERRED EMBODIMENTS

In this application, we will describe the invention as it is applied to the formation of a monocrystalline web of sapphire (Al$_2$O$_3$). It should be understood, however, that it has equal application to the manufacture of uniform webs, sheets and films of a variety of other inorganic monocrystalline, polycrystalline, and amorphous materials.

Figure 1:
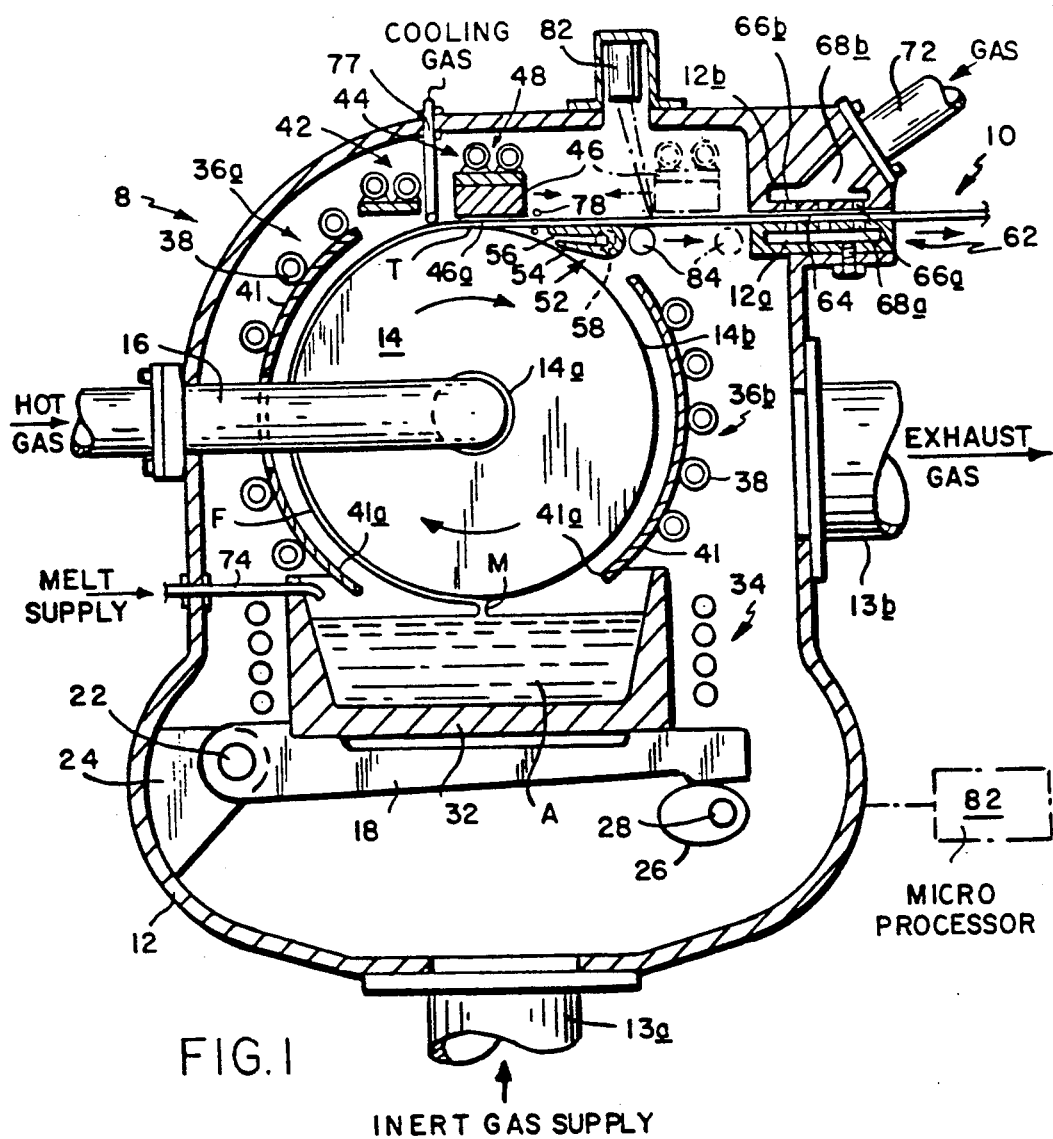
FIG. 1 is a diagrammatic view in vertical section of apparatus for making an inorganic web according to this invention.

Refer now to FIG. 1 of the drawings which shows apparatus 8 for making a thin, inorganic monocrystalline film or web 10 of sapphire (Al$_2$O$_3$). The web has a width that may be as great as 1 meter or more and practically unlimited length. The web is characterized by very uniform thinness, i.e., 1 to 100±0.01 microns, as well as exceptionally high tensile strength, i.e., 40000 kg/cm$^2$. In addition, web 10 has excellent optical clarity and surface perfection so that it can serve as a substrate or foundation for a variety of different electrial and optical products.

Apparatus 8 comprises a gas-tight pressure vessel or housing 12 that contains the various apparatus components required to make web 10. Normally, during operation of the apparatus, housing 12 is filled with an inert gas such as argon to provide a proper process atmosphere devoid of contaminants. However, in some applications only a high vacuum, e.g., 10$^{-8}$ Torr, need be maintained in the housing. Accordingly, the housing includes a gas inlet pipe or port 13a in its bottom wall for connection to a suitable gas supply and an outlet port 13b in its side wall for connection to an exhaust. The components inside the housing include a long (i.e., 1–2 meters), hollow, cylindrical drum 14 which is supported at an elevated position in housing 12 by way of a tubular axle 14a journaled in the housing wall. The drum is made of a heat-resistant material such as molybdenum or iridium. Hot gas is circulated through drum 14 by way of pipes 16 connected by rotary seals (not shown) to the opposite ends of axle 14a located outside of housing 12 so that the drum surface 14b can be heated to the temperature required to carry out the process. Alternatively, the drum surface can be heated by an appropriate electrical heater inside the drum. Drum 14 is rotated by a suitable electric motor (not shown) located outside of housing 12 and coupled to the drum axle 14a.

Directly undre drum 14 is a platform 18 which is more or less parallel to the drum axis. One edge, herein the left hand edge, of platform 18 is connected by pivots 22 to a pair of internal ears 24 projecting from the sidewall of housing 12 so that the platform 18 can be tilted up and down by a cam 26 mounted to an axle 28 rotatively supported in the housing wall. The curved surface of cam 26 bears against the underside of platform 18 at the right hand edge thereof so that when the cam is rotated in opposite directions, the platform is tilted up and down from its horizontal position shown in FIG. 1.

Platform 18 supports a relatively large heat-resistant molybdenum or iridium crucible 32 so that the crucible is directly under drum 14. During the operation of apparatus 8, crucible 32 contains a melt A of the material for making web 10 which is, in this example, Korund Al$_2$O$_3$. An RF heating coil 34 surrounding crucible 32 heats the crucible to a temperature well in excess of the melting point of the material in the crucible. In the present example, melt A has a melting point of 2050° C. so that the crucible 32 is maintained at a temperature iin the order of 2300° C. Normally, the surface of the melt A in the crucible is maintained close to the drum undersurface. As will be seen later, during operation of the apparatus 8, the spacing H (FIG. 2) of the melt A and the drum surface 14b is carefully controlled by adjusting the angular position of cam 26. Also, the crucible is continuously replenished with material so that the melt is not depleted.

Still referring to FIG. 1, cooling means in the form of cooling jackets 36a and 36b surround the upper portions of drum 14, along the entire drum length, being spaced a small distance from the drum surface 14b. Each such jacket includes an array of tubes 38 through which cooling liquid is flowed and a temperature distribution plate or heat sink 41 is in intimate thermal contact with those tubes so that heat is drawn uniformly from the drum surface portions opposite the cooling jackets.

Figure 3A:
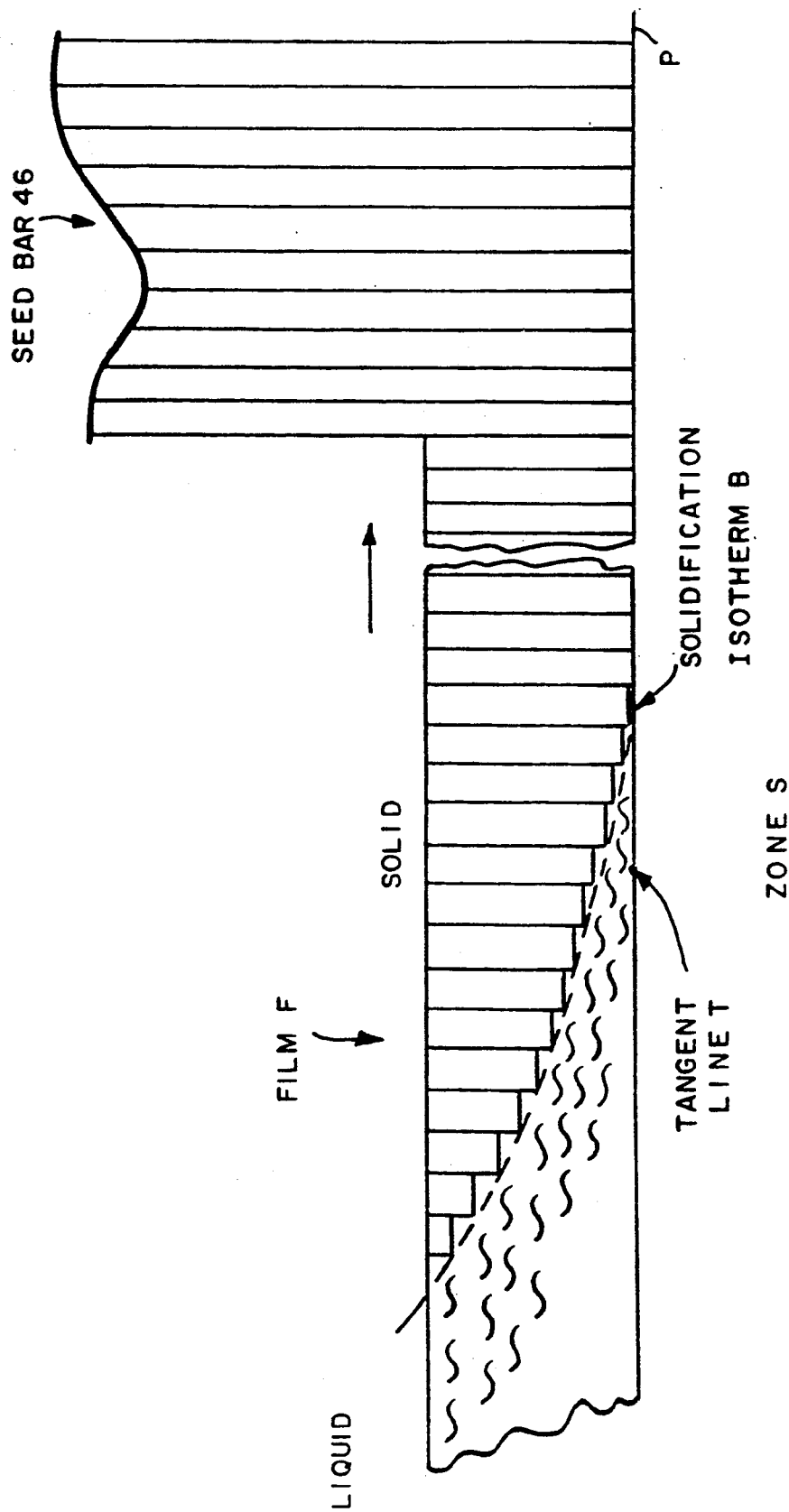
FIG. 3A is a diagrammatic view on a greatly enlarged scale illustrating the formation of the web by the FIG. 1 apparatus.
Figure 3:
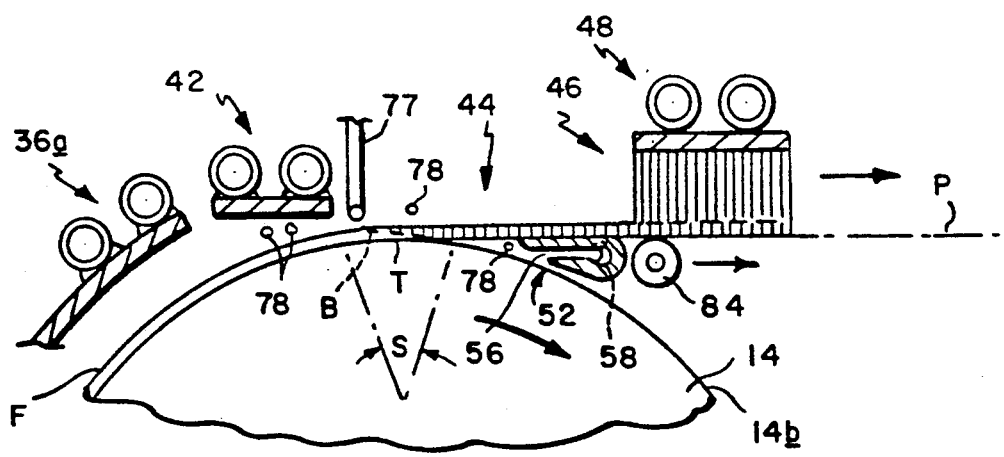
FIG. 3 is a similar view of another portion of the FIG. 1 apparatus.

Referring to FIGS. 1 and 3, positioned directly above drum 14 is a chiller 42 which is similar to, but smaller than, the cooling jackets 36a and 36b, as well as a seeding station shown generally at 44. Normally located at seeding station 44 is a seed bar 46. This bar 46 is coextensive with and parallel to drum 14 and consists of a single long crystal of the material desired for web 10, i.e., monocrystalline sapphire in the present example. Mounted to the top of bar 46 is a chiller 48 similar to chiller 42 and which extends the length of the bar. The bar 46 is supported at its opposite ends by suitable means (not shown) for moving the bar laterally between its solid and interrupted line positions indicated in FIG. 1. When bar 46 is in its solid line position at station 44, its undersurface 46a extends just to the left of the tangent line T at the top of the drum. As shown in FIG. 3, when the bar is moved between its two positions, its undersurface 46a is moved essentially along a plane P tangent to the drum surface and containing tangent line T.

When an inert gas atmosphere, rather than a vacuum, is being maintained in housing 12, a gas knife 52 may be suspended from the housing 12 sidewall, directly below the aforesaid tangent plane P. The knife extends beyond the ends of drum 14 and is closely spaced parallel to tangent line T at the top of the drum. A slot 56 extends almost the entire length of the knife edge 54 and one end of the slot communicates with a conduit 58 which extends through the wall of housing 12 to a suitable source of a pressurized inert gas, such as argon. When the gas knife is in operation, it directs a linear inert gas jet of exact and uniform temperature toward the tangent line T to keep the underside of the web liquid while providing a force to lift and separate the web from the drum.

As shown in FIG. 1, the apparatus housing 12 also includes an airlock 62 adjacent to the upper right hand edge of housing 12. The airlock has a slot 64 which is at least as long as the drum and lies in plane P. The opposite walls 12a and 12b of the slot contain a multiplicity of tiny orifices 66a and 66b which communicate with manifolds 68a and 68b connected to a common pipe 72 leading to suitable pressurized gas source. When gas (e.g., argon) is supplied to pipe 72, a gas curtain is developed in the slot 64 which prevents atmospheric air from entering housing 12 through the slot, yet allows web 10 to exit the housing through the slot.

To ready apparatus 8 to make web 10, seed bar 46 is moved to its solid line position in FIG. 1. Air is purged from housing 12 through its exhaust port 13b and the housing is filled through port 13a with an inert gas such as argon at a pressure in the order of 10 atmos. Also, the crucible heater 34 is turned on to raise the temperature of the material in the crucible well above the material's melting point to a level commensurate with the viscosity desired for that material. If additional melt material is needed to fill crucible 32, it may be added as a liquid or powder through a fill pipe 74 extending through the housing sidewall and over the crucible rim. In addition, drum 14 is rotated clockwise at a uniform slow rate, in the order of 6–10 rpm and hot gas is circulated through the drum via pipes 16 to heat the drum surface 14b to a temperature slightly above the melting point of $Al_2O_3$, e.g. 2051° C.

Figure 2:
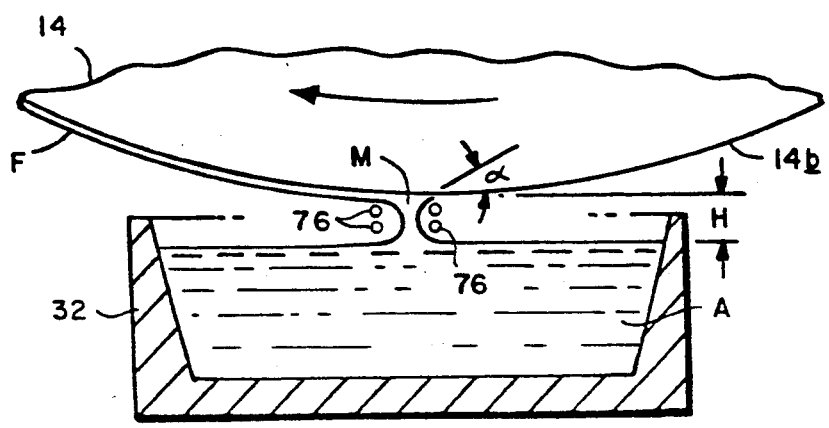
FIG. 2 is a fragmentary elevational with parts in section on a larger scale of a portion of the FIG. 1 apparatus.

To start the process, cam 26 is briefly rocked clockwise from its position shown in FIG. 1 so as to momentarily lift or bounce crucible 32. This motion introduces a traversing wave or ripple into the melt A in the crucible which causes the liquid to barely touch or "kiss" the drum surface 14b at the underside of the drum. As best seen in FIG. 2, this establishes a meniscus M of melt material which, due to wettability of the drum surface 14b, propagates the full length of the drum, stopping at the sharp edges at the opposite ends of the drum. The meniscus "waist line", i.e., the thinnest part of the meniscus cross-section, is determined by several factors. These include the spacing H of the drum surface 14b above the surface of melt A, the viscosity of the melt A, the velocity of the drum surface 14b and the wetting angle alpha of the melt material on the drum surface 14b due to surface tension. In a typical case, this angle is in the order of 10°.

Within the isolated volume of housing 12, the molten bath in crucible 32 establishes a large-area isothermal environment or envelope for the meniscus M along its full length, as well as a uniform thermal environment for the underside of the drum 14. Nevertheless, for proper process control, it is essential that the thermal emission of meniscus M be measured along its length to monitor the viscosity of the melt material comprising the meniscus. Accordingly, for this reason, apparatus 8 includes a plurality of pyrometer-detector units 76 aimed at the waist of the meniscus to measure that thermal emission.

Also, for the same control reasons, the apparatus includes conventional means such as a standard spindle drive (not shown) for controlling the angular position of cam 26 in order to control the distance H between the drum and the melt surface.

Still referring to FIG. 2, after the establishment of the mensicus M, continued rotation of drum 14 results in the deposit on the heated drum surface 14b of a thin liquid film F of the melt material in crucible 32. Since the melt is maintained at a precise temperature between 2051° and 2300° C. and the drum surface is to be maintained at only 2051° C., the gas circulated through drum 14 via pipes 16 actually absorbs and carries away heat which is radiated from the melt A and the film F deposited on the drum. For this reason, the underside of the drum adjacent crucible 32 will always be hotter (e.g., 2150° C.) than the upper portion of the drum. This elevated regional temperature of the drum undersurface helps to spread the liquid film F uniformly over that undersurface. As the molten film spreads along the drum surface preferably over at least a quadrant of the drum, it equalizes in thickness due to lateral surface tension to minimize any unevenness which may have moved beyond the meniscus M as a result of minute fluctuations in the width of the meniscus waist or cross-section. Thermal shields constituted by the lower edge margins 41a of the plates 41 prevent excessive radiated heat transfer from melt A to the drum surface.

Referring now to FIGS. 1 and 3, in a continuous process, the crucible 32 may be refilled from time to time with fresh melt material through pipe 74. Preferably, the material is added as a heated liquid so as not to unduly upset the temperature gradient established between the crucible and the drum.

As the drum continues to rotate, the liquid film F deposited on the drum is cooled by the cooling jacket 36a to a temperature equal to that of the drum, i.e., 2051° C., by the time the film is transported to chiller 42 and seeding station 44. Chiller 42 and the chiller 48 at seeding station 44 balance the radiated heat from drum 14 to maintain the seed bar 46 in the seeding station at a temperature just below the solidification temperature of the film F, i.e., 2049° C.

When the leading edge of the still liquid film F reaches the seeding station 44, the seed bar 46 is located at its solid line position in FIG. 1, extending just to the left of tangent line T with its working surface 46a in plane P facing the drum. Accordingly, the leading edge of film F is rotated into engagement with the bar surface 46a just ahead of the tangent line T. Immediately upon such contact, the film upper surface solidifies and "freezes" to the bar and the bar is moved along plane P in synchronism with the drum rotation. Because the drum surface is maintained at a temperature of 2051° C. and the seed bar is cooled to 2049° C., with the solidification of film occuring in between those two limits at about 2050° C., the film in chill zone S at station 44 is subjected to a temperature gradient of about 2° C. across its thickness. Resultantly, the upper surface or skin of film F in contact with the seed bar surface 46a at the left boundary of chill zone S tends to solidify before the film lower surface, adopting the crystal structure and morphology dictated by the crystal orientation of the seed bar 46. As the bar, together with the leading edge of the film, is moved horizontally to the right along plane P as shown in FIG. 3, the film F is peeled from the curved drum surface at tangent line T, while its undersurface is still in a liquid phase. It should be noted that the preferred growth direction is arranged by the seed bar in a manner whereby the c-axis of the sapphire crystal that is formed at zone S is perpendicular to the web surfaces, thus making the surfaces of the resultant web 10 exceedingly smooth.

As best seen in FIG. 3A, the film continues giving up its heat to the chilled bar 46 as the film moves through zone S so that an oblique solidification isotherm or front B that defines an acute angle with the tangent plane P is established through the film thickness, with the film solidifying completely by the time it reaches the right hand boundary of zone S. If necessary, when an inert gas atmosphere, rather than a vacuum, is maintained in the housing 12, a perforated gas pipe 77 (FIG. 3) extending the length of the drum may be provided at station 44 to direct a cool, inert gas, such as argon, to the film upper surface. This will assure the solidification of the upper portion of the film with the crystal orientation of the seeding bar ahead of the tangent line T at which the film, whose underside is still unsolidified, is peeled from the drum surface 14b. The web separation from the drum is aided by the different thermal coefficients of contraction of the web material and the drum.

As the seed bar 46 moves along plane P away from tangent point T, the peeling of the film F from the drum is assisted by the linear jet of argon gas issuing from slot 56, just to the right of the line of departure of the film. The gas is preheated to a temperature that maintains the film underside as a liquid until after it leaves the drum surface. Just as important, it applies a gentle force to the underside of the film which assists in the stripping of the film from the drum. Thus, by the time the film leaves zone S, it is solidified completely, with the underside or lower portion of the film having the same crystal orientation as the upper portion of the film, i.e., the crystal structure of bar 46. If the system operates in vacuum, the gas jet is, of course, not used.

Still referring to FIG. 3, in order to assure a constancy of the replication of the seed bar 46 crystal structure in the film F, it is essential that the proper thermal gradient be maintained across the thickness of the film F in zone S. To accomplish this, the heat supplied to the film from the drum and gas knife 52 and the heat removed through the film to the chilled seed bar 46 and/or by radiation are controlled accurately and maintained at stable levels. To achieve such close control, apparatus 8 includes a set of pyrometers and optical reflection detectors 78 that monitor the temperature of the upper and lower film surfaces along the solidification zone S. The outputs from these detectors are applied to a standard feedback circuit (not shown) to control the temperature of the chiller 48, the speed of seed bar 46 away from the seeding station and the flow of gases from gas knife 52 and pipe 77 (if present).

Once the desired crystal structure and lattice constant have been imprinted on the leading edge margin of film F, that same crystal morphology propagates along succeeding portions of the film as they are advanced through zone S. When the seed bar 46 approaches its dotted line position shown in FIG. 1, it is separated from the solidified film by suitable means, such as a laser knife 82. The severed leading edge of the film is picked up by a vacuum roller 84 which is moved to the right at the same rate as bar 46 or the film is floated on a cushion of gas and advanced out of the housing through air lock 62 as a thin, flexible monocrystalline sapphire web 10. In the meantime, the seed bar is withdrawn above and away from the web plane P.

Although not shown in FIG. 1, to assure uniform production of web 10, a second drum may be included in housing 12 to the right of, and rotating with, drum 14. The second drum is arranged to reverse-wind the film leaving drum 14, giving it more than ample time to cool and solidify in the controlled atmosphere of housing 12 without imparting any force to the solid film still forming at seeding station 44. After it leaves the housing, the inorganic monocrystalline web 10 can be conducted via a conventional festoon or accumulater to a laser slitter or web winder.

Apparatus 8 also includes a microprocessor 85 for controlling the steps of the web-forming process. To control the deposition of film F on the drum surface, the microprocesser receives signals from pyrometer-detector units 76, as well as from heat sensors (not shown) monitoring the temperatures of melt A and drum 14. In addition, it receives inputs reflecting the speed of drum 10 and the spacing H between the drum and the melt. It processes this data to develop control signals for the heaters and for the spindle drive that orients cam 26 so as to maintain a selected constant spacing H and a selected meniscus M cross-section to lay a very uniform liquid film F onto drum surface 14b. The microprocessor 85 also controls the actual formation of web 10 at the seeding station 44 using the aforesaid temperature and drum speed data and the data from pyrometer-detectors 78 to appropriately regulate the chillers 36a, 36b, 42, and 48 and the gas flows through gas knife 52 (and pipe 77) at the chill zone S to produce web 10 having the desired thickness.

As a result of the method steps performed by apparatus 8, wide thin webs or ribbons having very uniform crystal structures and surface smoothnesses may be produced on a continuous basis. Indeed, web 10 can have a thickness or cross-section in the range of 1 micron to several hundred microns, which is as much as 100 times less than the thicknesses of the thin wafers and plates made by conventional methods, giving web 10 a flexibility comparable to that of plastic film. Furthermore, this thinness is achieved without having to grind or otherwise finish the web which treatment can cause breakage and surface defects in the web. This enables the crystal web 10 to be used in applications which have never been feasible before because of the limitations on the attainable thinnesses and perfections of convential webs and plates. Web 10, being so thin, is able, during the manufacturing process, to dissipate its latent heat rapidly and uniformly to assure solidification of the sheet with a uniformly perfect crystal lattice. Because of the absence of defects in its crystal lattice, the web has extraordinary tensile strength and dimensional stability, as well as great optical clarity and a uniform refractive index, allowing its use for very sensitive optical and optoelectronic applications.

A typical sapphire web made in accordance with this invention with its c-axis perpendicular to the plane of the web has the following properties:

| | |
|---|---|
| Hardness (Knoop c-axis) | 2,200 |
| Tensile strength (ult psi) | 355,000 |
| Compressive strength (psi) | 447,000 |
| Mod. of elasticity (psi) | $67.4(10)^{-6}$ |
| Coeff. of friction (vs. steel) | 0.15 |
| Melting point (°C.) | 2,053 |
| Thermal expan. coeff. (c-axis) (in/in/°C.) | $4.5(10)^{-6}$ |
| Thermal conduct. (cal/(sec-cm-°C.) | 0.086 |

Web 10, being uniform and defect free, particularly at its surfaces, is especially adapted for use as a "seed" base or foundation for one or more layers of inorganic materials added to web 10 to propagate to the added layers, crystal morphologies compatible with that of web 10. The result is a ribbon-like multilayer hetero-epitaxially grown structure having a coherent crystal morphology, but whose layers may have different electrical, optical and/or chemical properties.

Figure 4:
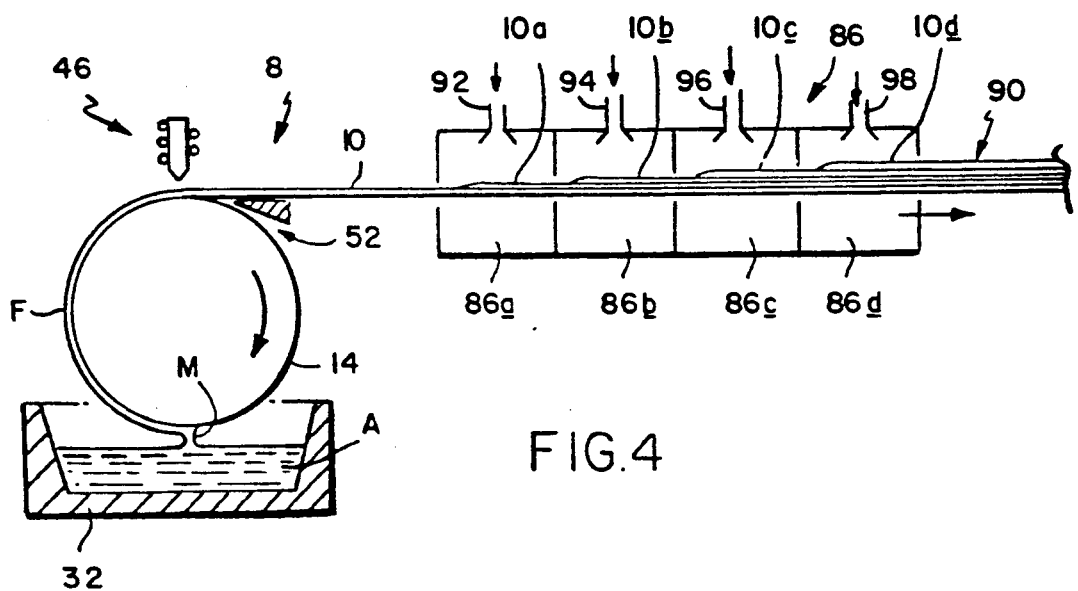
FIG. 4 is a diagrammatic view of apparatus for making a plural-layer web according to the invention.
Figure 5:
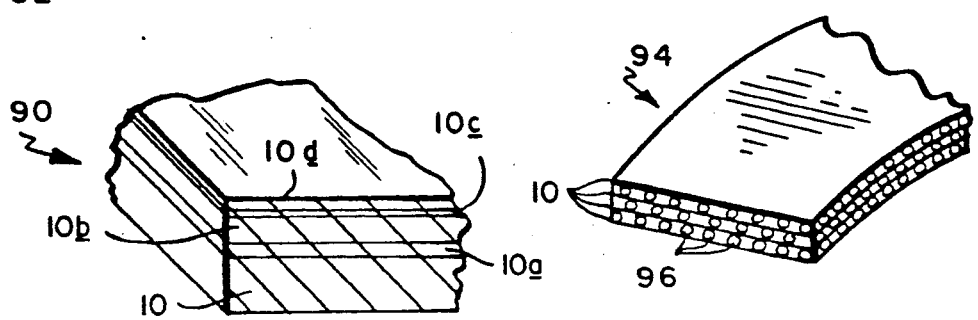
FIGS. 5 and 6 are fragmentary sectiona views of articles made using the FIGS. 4 and 1 apparatus respectively.

For example, and referring to FIGS. 4 and 5, the monocrystalline web 10 produced by apparatus 8 may be used as a substrate or base layer for a unique plural layer, optoelectronic recording medium having a coherent crystal morphology indicated generally at 90 in these figures. This medium is described in detail in Applicant's application Ser. No. 872,899, of even date herewith, entitled INTERACTIVE IMAGE RECORDING METHOD AND MEANS, now U.S. Pat. No. 4,862,414 and the disclosure there is incorporated herein by reference.

Suffice it to say here that the web 10 from apparatus 8 is conducted through an oven 86 having a series of sections or compartments. In oven compartment 86a, $SiH_2Cl_2$ gas doped with phosphorus atoms is introduced through a pipe 92. Such doping is also achievable through diffusion from the sapphire base 12. Simultaneously, that section is heated. Using a conventional R.F. sputtering process, an inorganic silicon-based conductive zone on electrode layer 10a is deposited on the web. The lattice spacing of the diamond-cubic silicon crystal is compatible with that of the rhombohedral sapphire crystal comprising web 10 so that a compatible defect-free crystal morphology is adopted in layer 10a, with web 10 providing nucleation sites for the growth of the layer 10a. The web then enters oven section 86b which receives undoped $SiH_2N_4$ and gass through a pipe 94 so that a photosensitive silicon layer 10b is sputtered onto layer 10a. The layer 10b material, being essentially the same as that of layer 10a, continues the same crystal morphology. The web 10 with its sputtered-on layers or zones 10a and 10b then proceeds into oven section 86c where an interfacial zone or layer 10c of an isotropic dielectric material such as silicon dioxide (SiO) is added to zone 10b. This is accomplished by introducing $O_2$ and $SiHN_4$ gases through a pipe 96 into oven section 86c maintained at the appropriate temperature. Finally, the web proceeds to oven section 86d receiving pure $SiH_4+NH_3$ gas through a pipe 98. This lays down on layer 10c a silicon nitride storage layer 10d. Preferably, the process temperature in each oven section is less than the temperature in the preceding section so that the deposit of each layer of the web does not degrade the preceeding layer. The materials of layers 10c and 10d have a lattice spacing compatible with that of layers 10a and 10b and, therefore, the same crystal morphology is continued into layer 10d. Resultantly, the finished plural-layer medium 90 leaving oven 86 is a coherent hetero-epitaxially grown crystal structure throughout as indicated in FIG. 5, although its added-on coatings, zones or layers 10a to 10d have different electrical, optical and chemical characteristics from web 10, as well as from each other. These unique properties enable medium 90 to function as a superior optoelectronic recording medium as described in the above pending application, or as a substitute for electronic microcircuitry.

Using the same process, other mulitlayer structures may be constructed in a similar way with a coherent morphology for use as components and machine elements in applications where the innate properties, i.e., heat resistance, strength, etc., of each layer can be combined or be put to maximum use. For example, using the thin flexible inorganic web 10 as a highly insulating substrate, it is possible to stamp out from the web a flexible circuit or jumper cable and then grow the solid state components directly on the circuit substrate by depositing additional material layers on the substrate as described above using standard masking techniques. This procedure avoids solder connections, component misalignment and thermal cooling problems which adversely effect similar circuits made by prior techniques. The resultant composite, custom designed circuit structure has several advantages, including the ability to operate in a high temperature environment and the inspectability of the circuit thorugh the thin monocrystalline base layer because of its transparency. Since the web 10 can be made with a much lower lattice defect rate and thinner so that heat can be conducted away with greater effectiveness, the circuit elements will operate faster at higher energy levels and with lower failure rates. Additionally, in such a circuit, the very high dielectric constant of the inorganic monocrystalline material comprising web 10 permits the use of that substrate as an integral capacitor element where needed as part of the composite circuit structure.

Figure 6:

By taking advantage of this method of producing very large, thin, lightweight flexible inorganic webs, ribbons or sheets having great tensile strength and dimensional stability, it is now possible to build very strong multilayer structures with these webs 10. For example, FIG. 6 shows a hollow structure 102 composed of web 10 layers fused together by way of spacers 104 (e.g., tiny rods or beads) made of the same material. Before fusing, the flexible webs can be formed so that the resultant structure has the desired shape. The illustrated structure 102 is a hollow, lightweight, thermally insulating structure which is extraordinarily stiff and strong with internal passages through which fluid can be stored or flowed for heating and cooling purposes. For example, structure 102 could be an airplane wing.

In a variation of the aforesaid plural layer structure, the various inorganic webs or sheets may be superimposed with their crystal directions criss-crossed and pressed into a form while still thin and flexible. In this way, they become fused into a single laminated structure which is thin and lightweight, yet still especially strong and dimensionally stable. Such multilayer structures can be out and shaped to form liners, turbine blades and other structural parts which have to withstand high temperature conditions. Such a multilayer web can even be formed into a roll or tube and fused to itself in a manner whereby the lattice structure of the web is restablished upon the solidification of the temporarily molten state of the weld seam, thus producing a full-strength joint of the very same material used to make the tube. This weldability allows for the construction of, for example, a lightweight axle or crank shaft or even a hollow piston for use in an internal combustion engine.

It is apparent from the forgoing, then, that the above described method and apparatus enable the production of very large webs and sheets of monocrystalline inorganic materials characterized by their exceptionally high tensile strength, dimensional stability and temperature resistance. Yet the same structures are very thin and lightweight, flexible or rigid as desired, transparent as desired and of uniform surface smoothness and optical clarity. Because for the first time such webs and sheets can be made reliably on a production basis, myriad electrical, optical and structural components and parts heretofore unattainable can now be fabricated so as to utilize the unique properties and characteristics of the inorganic single or plural-layer sheets and webs described herein.

It will thus be seen that the objects set forth above, amoung those made apparent from the preceding description, are efficiently attained. Also, certain changes may be made in the above method and apparatus and in the articles described without departing from the scope of the invention. For example, although we have described apparatus 8 as it makes a monocrystalline web 10, it should be understood that the apparatus can also make large, uniformly thin, inorganic webs that have a polycrystalline or even amorphous morphology by appropiately selecting the seed bar 46. Therefore, it is intended that all matter contained in the above description or shown in the accompanying drawings, be interpreted as illustrative and not in a limiting sense.

It is also to be understood that the following claims are intended to cover all of the generic and specific features of the invention herein described.

What is claimed as new and desired to be secured by Letters Patent of the United States is:

1. Apparatus for making a continuous thin web of inorganic material having a selected uniform morphology comprising
   A. a crucible for containing a melt of said material;
   B. means for heating the crucible to a selected temperature that maintains said material therein in its liquid phase;
   C. a wettable support surface positioned above said crucible in a position to momentarily contact the surface of the melt in said crucible, said support surface being wettable by said material and heated to a temperature sufficient to maintain said material in its liquid phase;
   D. means for momentarily contacting said support surface with said melt material in said crucible to establish a meniscus that extends down from said support surface to said melt surface;
   E. means for moving said support surface relative to said crucible at a controlled rate so as to maintain said meniscus whereby melt material is drawn from said crucible via the meniscus and spreads evenly over said support surface as a liquid film;
   F. chiller means positioned adjacent to said support surface opposite the exposed surface of the film thereon, said chiller means establishing a chill zone at the surface of the film which is maintained at a temperature below the melting point of said material while said support member maintains the undersurface of said material of the film in its liquid phase so that the movement of the support surface causes successive portions of the film to advance through said chill zone and solidify along an oblique solidification front such that the exposed surface of the film solidifies before the film undersurface;
   G. cyrstal seeding means positioned adjacent to said chiller means opposite the film in the chill zone,
   H. means for contacting the film in said chill zone with the seeding means so that as the film solidifies, it assumes the crystal morphology of the seeding means;
   I. means for moving the seeding means in the same direction and speed as the support surface so as to maintain contact with the film until after the film leaves the chill zone and solidifies, the crystal morphology of the seeding bar being propagated to succeeding portions of the film as they pass through the chill zone; and
   J. housing means for enclosing all of said previously mentioned means in a vacuum or inert environment.

2. The apparatus defined in claim 1 wherein said support surface is the circumferential surface of a rotary drum.

3. The apparatus defined in claim 1 and further including means for maintaining the crucible, drum, chiller means and seeding means in an atmosphere free of contaminants.

4. The apparatus defined in claim 1 and further including stripper means positioned downstream from the chiller means for peeling film from the support surface.

5. The apparatus defined in claim 4 and further including means located downstream from the stripper means for accumulating film after it has solidified to form a web.

6. The apparatus defined in claim 4 wherein said stripper means comprise a linear gas stream aimed at the line of separation of said film undersurface from said support surface.

7. The apparatus defined in claim 6 wherein said gas stream constitutes hot has which maintains the undersurface of the film separating from the supporting surface in its liquid phase until after the film has separated from said support surface.

8. The apparatus defined in claim 1 and further including means for monitoring the temperature of the film in said chill zone and means responsive to said monitoring means for controlling the thermal gradient through the film in said zone so as to establish an isothermal front in the film that is oriented or angled so that the upper surface of the film solidifies prior to the film leaving the support surface, while the opposite film surface remains a liquid until after the film leaves the support surface.

9. The apparatus defined in claim 1 wherein said drum, chiller menas and seeding means are at least one meter in length.

10. The apparatus defined in claim 1 and further including means in the controlled environment of said housing means and downstream from said moving means for depositing one or more material layers on said formed web.

11. The apparatus defined in claim 10 wherein said depositing means comprise one or more coating ovens arranged in series.

* * * * *